United States Patent
Deng

(10) Patent No.: US 6,362,660 B1
(45) Date of Patent: Mar. 26, 2002

(54) CMOS LATCH AND REGISTER CIRCUITRY USING QUANTUM MECHANICAL TUNNELING STRUCTURES

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/615,419

(22) Filed: Jul. 13, 2000

Related U.S. Application Data

(60) Provisional application No. 60/143,614, filed on Jul. 13, 1999.

(51) Int. Cl.[7] .......................... H03K 19/20; G11C 19/00
(52) U.S. Cl. .......................... 326/134; 326/2; 326/132; 377/77; 377/78; 365/175; 365/72; 257/24; 257/25
(58) Field of Search .......................... 326/2, 133, 134; 365/175, 156, 72; 377/78, 79, 128; 257/22, 24, 25

(56) References Cited

U.S. PATENT DOCUMENTS

| | | | |
|---|---|---|---|
| 5,714,891 A | * | 2/1998 | Lin et al. ........................ 326/59 |
| 5,770,958 A | * | 6/1998 | Arai et al. ..................... 327/114 |
| 5,869,845 A | * | 2/1999 | Vander Wagt et al. ......... 257/25 |
| 5,930,323 A | * | 7/1999 | Tang et al. ..................... 377/77 |
| 5,953,249 A | * | 9/1999 | van der Wagt ............. 365/175 |

OTHER PUBLICATIONS

"Transistors and Tunnel Diodes for Analog–Mixed–Signal Circuits and Embedded Memory," IEEE International Electron Device Meeting, Dec. 6–11, 1998, pp. 1–4 (A. Seabaugh, X. Deng, T. Blake, B. Brar, T. Broekaert, R. Lake, F. Morris and G. Frazier).

* cited by examiner

Primary Examiner—Michael Tokar
Assistant Examiner—Vibol Tan
(74) Attorney, Agent, or Firm—Pedro P. Hernandez; W. James Brady, III; Frederick J. Telecky, Jr.

(57) ABSTRACT

CMOS semiconductor latch and register (500) circuitry is disclosed, comprising a first tunneling structure latch circuit (502); data input circuitry (506), coupled and adapted to pass data to (504) said first tunneling structure latch circuit (502), a second tunneling structure latch circuit (514), data transmission circuitry (516), coupled between said first and second tunneling structure latch circuits, and adapted to transfer data from said first tunneling structure latch circuit to said second tunneling structure latch circuit, and data output circuitry (518), coupled to (512) said second tunneling structure latch circuit (514).

10 Claims, 2 Drawing Sheets

CMOS LATCH AND REGISTER CIRCUITRY USING QUANTUM MECHANICAL TUNNELING STRUCTURES

This application claims benefit of Prov. No. 60/143,614 filed Jul. 13, 1999.

The U.S. Government has a paid-up license in this invention and the right in limited circumstances to require the patent owner to license others on reasonable terms as provided for by the terms of F49620-96-C-0006 awarded by DARPA.

TECHNICAL FIELD OF THE INVENTION

The present invention relates, in general, to logic circuitry used in electronic devices, and in particular, to latch and register circuitry designed for a Complementary Metal Oxide Semiconductor (CMOS) process including quantum mechanical tunneling structures.

BACKGROUND OF THE INVENTION

The continual demand for enhanced transistor and integrated circuit performance has resulted in improvements in existing devices, such as silicon, bipolar, and CMOS transistors and Galium Arsenide (GaAs) transistors, and also in the introduction of new device types and materials. In particular, scaling down device sizes to enhance high frequency performance leads to observable quantum mechanical effects, such as carrier tunneling through potential barriers. These effects led to development of alternative device structures which take advantage of such tunneling phenomenon; such as tunneling, and resonant tunneling, diodes and transistors. For ease of reference, all such structures are hereafter collectively referred to as tunneling diodes (TDs).

Tunneling diodes are generally two terminal devices with conduction carriers tunneling through potential barriers to yield current-voltage curves with portions exhibiting negative differential resistance (NDR). This negative differential resistance characteristic has been used as the basis for a wide range of high performance designs.

Conventionally, tunneling and resonant tunneling diodes have been limited in implementation to GaAs and other high performance processes. Conventional methods have focused on building TDs in GaAs for several reasons; mainly because the speed characteristics and small process features of GaAs processes were conducive to tunneling mechanics. However, performance considerations such as difficulty controlling peak current in TDs, limited their practical application and use. Additionally, since GaAs processes were not practical or cost efficient for high-volume, consumer-related production, TDs were generally limited in application to research and developmental applications.

Previously, the feature size of standard silicon processes, such as CMOS, was not conducive to producing such tunneling structures. Other conventional methods of utilizing tunneling structures in conjunction with standard silicon processes entailed fabrication of a TD structure in a non-silicon process, followed by transferring and bonding (or electrically coupling) the TD structure to a host silicon substrate. While certain performance issues may have thus been addressed, such a process required extra design time and processing steps. The additional design and fabrication costs associated with these approaches is therefore not commercially viable for large volume logic device production.

Thus, conventional implementations of tunneling structures have been used only in discrete form and niche applications, such as high speed pulse and edge generation; produced in costly, high-performance processes. Limitations to conventional tunneling structures include the difficulty in controlling peak current and the lack of an integrated circuit process capable of commercially producing tunneling structures in a commercially viable format.

In the absence of commercially viable TDs, conventional CMOS logic circuit designs have utilized functional components readily available in the CMOS process, such as inverters and logic and transmission gates. Conventional methods have focused on optimizing the design of these components individually, and improving their efficiency when utilized within larger circuits. Such conventional methods inevitably yield device inefficiency; due mainly to layout area, power consumption, and operational speed limits resulting from standard CMOS components.

As performance demands have increased and feature sizes for CMOS processes have decreased, fabrication of tunneling structures in a production CMOS process becomes feasible. Tunnel diode growth on silicon is relatively immature. Recently, CMOS compatible tunnel diodes have been demonstrated to show that a wide range of current densities can be obtained; addressing requirements for imbedded memory and signal processing applications.

Therefore, a system of logic circuitry designs incorporating tunneling structures for a CMOS process is now needed; providing enhanced design performance and efficiency while overcoming the aforementioned limitations of conventional methods.

SUMMARY OF THE INVENTION

In the present invention, latch and register circuitry is designed for a CMOS process including quantum mechanical tunneling structures; providing decreased circuit layout area, decreased power consumption, and increased operational speed. NDR and current-voltage (I-V) characteristics of tunneling structures are exploited to provide high-performance, high functionality logic circuitry. Tunneling structures are utilized, replacing numerous conventional CMOS components, to compensate MOS leakage and provide data latching with optimized system performance.

In one embodiment of the present invention, tunneling diodes are paired together in a totem pole fashion, providing a latch functionality. A further embodiment combines the tunneling diode pair with a pass gate and an inverter to provide latch circuitry.

Another embodiment of the present invention combines multiple instances of the latch circuitry taught by the present invention to provide data register circuitry.

A further embodiment of the present invention combines tunneling diode pairs with transistors and inverters; providing flip-flop logic circuitry.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 4b is an illustrative graph of current-voltage characteristics for the embodiment depicted in FIG. 4a;

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention defines logic circuitry employing tunneling structures in a homogenous silicon process; providing increased performance and design optimization. The present invention provides reduced circuit complexity for latch and register circuits; decreasing the number of circuit components used, the number of interconnects, and the number of delay stages. The present invention thus realizes a significant reduction in layout area, operation delay, and power consumption over conventional methods. NDR and current-voltage (I-V) characteristics of tunneling structures are exploited to provide high-performance, high functionality logic circuitry.

For purposes of illustration, latch and register circuitry utilizing resonant tunneling diodes (RTDs) is provided. However, the principles and applications of the present invention are applicable to resonant tunneling diodes as well as Esaki ($p^+n^+$) diodes; hereafter collectively referred to as tunneling diodes (TDs). TDs are desirable for use in high speed logic circuit applications due to the fact that their switching speed is generally faster than standard MOS structures. TDs are well-known for their intrinsic bi-stability and high-speed switching capability due to their negative differential resistance (NDR) characteristic. High current density, low capacitance, and the NDR of TDs make them very fast non-linear circuit elements. These same device characteristics can be exploited in high-speed, low-power, digital logic circuits. Thus, in most general purpose applications, where a large fraction of the circuits may be idle at any given time, the present invention provides a significant advantage over conventional methods because CMOS structures have lower tunnel power dissipation due to very low static power consumption.

Figure 1:
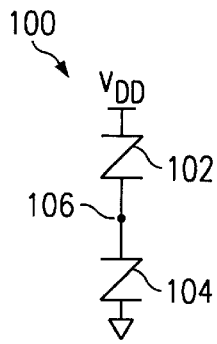
FIG. 1 is a schematic of a tunneling diode pair according to the present invention.

Referring now to FIG. 1, the present invention provides a pair 100 of TDs in series. Load TD 102 and drive TD 104 are coupled together forming node 106. TD 102 is coupled at its opposite end to a bias voltage, and TD 104 is coupled at its opposite end to ground. Drive TD 104 is biased through load TD 102. Pair 100 forms a bi-stable latch when voltage is biased within a suitable range.

Biased below that range, the pair 100 is monostable. As a latch, its state is given by the data node 106 voltage; high for the "1" state or low for the "0" state. More generally, the state of the pair, which may not be in static equilibrium, will be specified by the instantaneous voltage and current drive TD 104.

Figure 2:
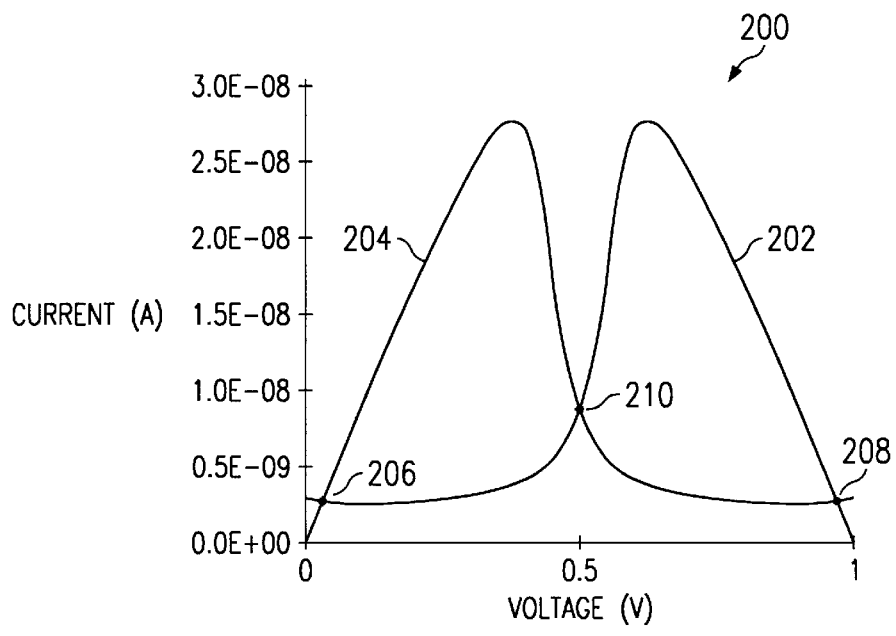
FIG. 2 is an illustrative graph of current-voltage characteristics for a tunneling diode pair.

FIG. 2 depicts a current-voltage plot 200 of pair 100. Referring now jointly to FIGS. 1 and 2, current-voltage characteristics of TDs 102 and 104 are represented by curves 202 and 204, respectively. At the two stable equilibrium states, first state 206 and second state 208, of pair 100, device tunneling currents are equal for the TDs. These currents are also equal at a third state 210, where the NDR regions of the two TDs cross; a point of unstable equilibrium. For a TD pair in one of the stable equilibrium states, 206 or 208, a voltage fluctuation creates an imbalance between the two TD tunneling currents that charges or discharges the circuit and device capacitances in such a way as to drive the node voltage back toward the equilibrium value. For a pair in the unstable equilibrium state 210, an imbalance between the currents forces the node voltage away from the unstable equilibrium value. Since the unstable state 210 is between the two stable states 206 and 208, the pair 100 will always shift to stable state 206 or 208.

External currents into and out of data node 106 influence the future state of the latch. To store a new value in the latch, bias voltage is lowered into monostable range long enough for the state of pair 100 to go low. Bias voltage is then restored to bias stable level, and pair 100 shifts to one of the stable states, a process referred to as the monostable bistable transition (MBT). The latch's final state is determined primarily by the amount of current injected into data node 106 during MBT. If the current injected is above a threshold level, the latch shifts to state 208 (signifying a "1"); for currents below this threshold level, the latch shifts to state 206 (signifying a "0").

Figure 3:
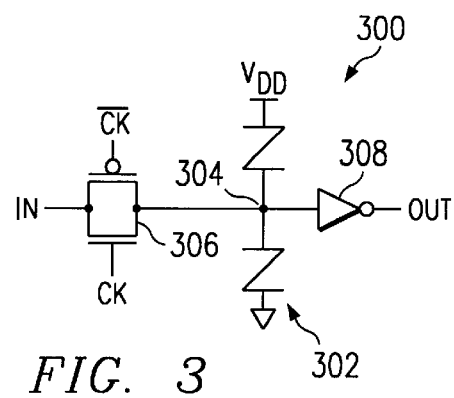
FIG. 3 is a schematic illustrating one embodiment of the present invention.

Referring now to FIG. 3, these principles are applied in the provision of a latch circuit 300 according to the present invention. Tunnel diode pair 302 is provided with data node 304. Input element 306 is coupled to pair 302 at node 304. Similarly, output element 308 is coupled to pair 302 at node 304. For purposes of illustration, element 306 is depicted as a complementary pass gate with complementing clock inputs. Additionally, output element 308 is depicted as an inverter gate. As should be apparent to one skilled in the art, other input and output elements and contrivances are possible depending upon desired performance and design requirements. All such possibilities and combinations are comprehended by, and do not alter the underlying principles of, the present invention.

Figure 4A:
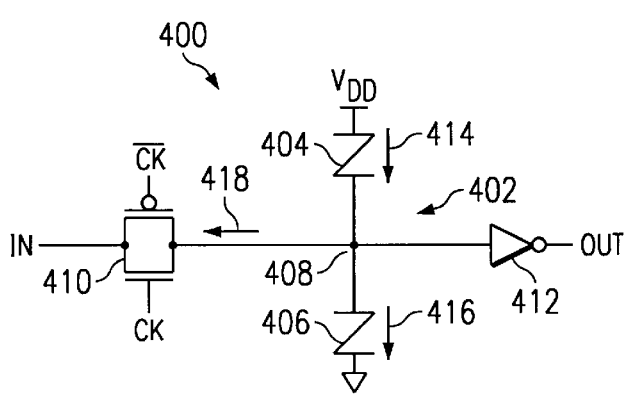
FIG. 4a is a schematic illustrating one embodiment of the present invention.
Figure 4B:
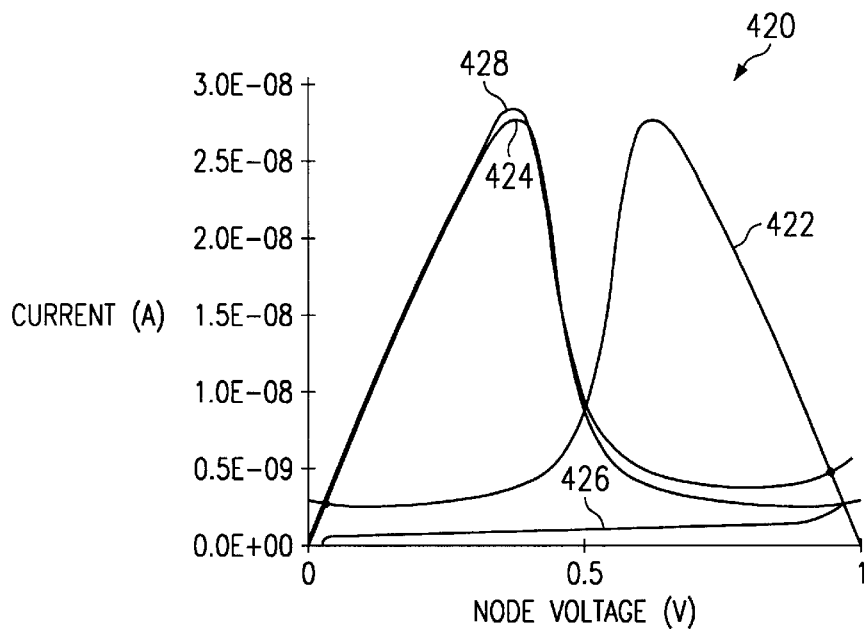

An important aspect of this latch circuitry is illustrated in reference to FIGS. 4a and 4b. In FIG. 4a, latch circuit 400 includes TD pair 402. Pair 402 comprises load TD 404 and drive TD 406., coupled together at data node 408. Input element 410 and output element 412 are coupled to pair 402 at node 408. Operational current 414 across TD 404, current 416 across TD 406, and MOS leakage current 418 are shown, representative of an operational CMOS circuit, in relation to the circuit elements.

FIG. 4b shows a plot 420 of the current-voltage characteristics of circuit 400. Curve 422 corresponds to current 414, curve 424 corresponds to current 416, and curve 426 corresponds to current 418. Curve 428 represents the sum of curves 424 and 426.

As it should be apparent to one skilled in the art, the circuitry of the present invention provides a significant advantage. The TD peak current is greater than the sum of the MOS leakage and TD valley currents. Thus, the TD current compensates for MOS leakage current, holding the memory state. The present invention thus provides high stability and overall design reliability.

Figure 5:
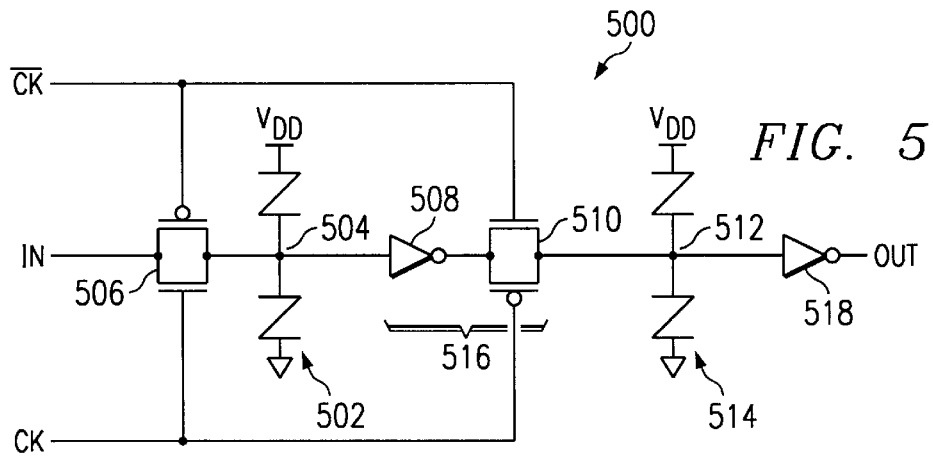
FIG. 5 is a schematic illustrating one embodiment of the present invention.

Shift registers are useful applications of the advantages provided by the present invention. Because of the latching nature of gates and clock transition requirements, most circuits implemented in CMOS technologies rely to some extent on shift registers as a basic element. By cascading multiple instances of latch 300 from FIG. 3, a CMOS/RTD static shift register (or D flip flop) 500 is implemented as shown in FIG. 5.

First TD pair 502 has node 504. A first input element 506 coupled to pair 502 at node 504, as does a first output element 508. Second input element 510 couples at one end to element 508, and at another end to data node 512 of second TD pair 514. Thus, elements 508 and 510 combine to form a transmission element 516 between pairs 502 and 514. Further, output element 518 couples to pair 514 at node 512.

As depicted, a complementary pass gate is used as element 506 to pass data under control of a clock signal. By way of comparison, conventional CMOS static shift registers typically include a feedback loop consisting of an inverter and a complementary pass gate, used to hold the storage voltage statically. With the present invention, 2 invertors and 2 pass gates are eliminated; resulting in the CMOS/RTD shift register of the present invention having substantially smaller area, substantially higher speed, and substantially lower power consumption in comparison with its CMOS counterpart.

Figure 6:
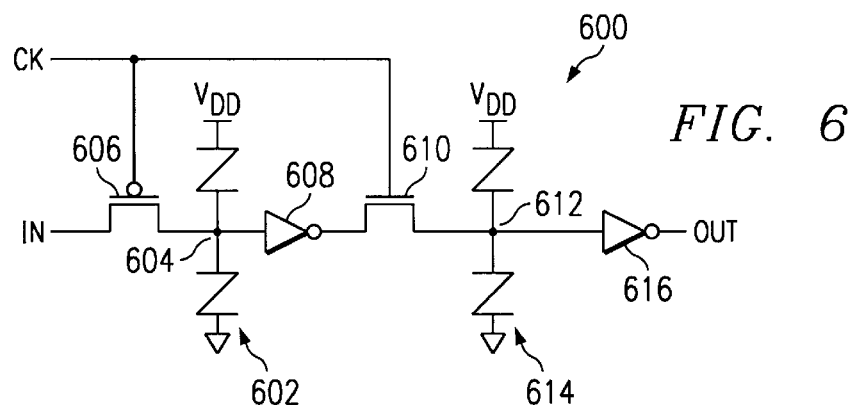
FIG. 6 is a schematic illustrating another embodiment of the present invention.

A single clock CMOS/RTD static shift register 600 may be similarly designed, as shown in FIG. 6. First TD pair 602 has node 604. A first input element 606 coupled to pair 602 at node 604, as does a first output element 608. Second input element 610 couples at one end to element 608, and at another end to data node 612 of second TD pair 614. Thus, elements 608 and 610 combine to form a transmission element between pairs 602 and 614. Further, output element 616 couples to pair 614 at node 612.

Again, the CMOS/RTD single clock static shift register 600 of the present invention has substantially smaller area, substantially higher speed, and substantially lower power consumption than its typical CMOS circuit counterparts.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A CMOS semiconductor latch device comprising:
   tunneling structure latch circuitry;
   a complementary pass gate data input circuitry, directly connected to said tunneling structure circuitry and adapted to pass data to said tunneling structure latch circuitry; and
   data output circuitry, coupled to said tunneling structure latch circuitry, and adapted to output data received therefrom.

2. The device of claim 1 wherein said tunneling structure latch circuitry further comprises:
   a first tunneling diode having a first end coupled to ground and a second end; and
   a second tunneling diode having a first end coupled to said second end of the first tunneling diode, and a second end coupled to a power source.

3. The device of claim 2 wherein said data input and output circuitry couple to said tunneling structure latch circuitry conjointly with the coupling between said first and second tunneling diodes.

4. The device of claim 1 wherein said data output circuitry further comprises inverter circuitry.

5. A CMOS semiconductor register device comprising:
   a first tunneling structure latch circuit;
   complementary pass gate data input circuitry, directly connected to said first tunneling structure latch circuit and adapted to pass data to said first tunneling structure latch circuit;
   a second tunneling structure latch circuit;
   data transmission circuitry, coupled between said first and second tunneling structure latch circuits, and adapted to transfer data from said first tunneling structure latch circuit to said second tunneling structure latch circuit; and
   data output circuitry, coupled to said second tunneling structure latch circuit, and adapted to output data received therefrom.

6. The device of claim 5 wherein said data output circuitry further comprises inverter circuitry.

7. The device of claim 5 wherein each of said first and second tunneling structure latch circuits further comprises:
   a first tunneling diode having a first end coupled to ground and a second end; and
   a second tunneling diode having a first end coupled to said second end of the first tunneling diode, and a second end coupled to a power source.

8. The device of claim 7 wherein said data input circuitry couples to said first tunneling structure latch circuit conjointly with the coupling between said first and second tunneling diodes.

9. The device of claim 7 wherein said data output circuitry couples to said second tunneling structure latch circuit conjointly with the coupling between said first and second tunneling diodes.

10. The device of claim 5 wherein said data transmission circuitry further comprises:
    inverter circuitry coupled to said first tunneling structure latch circuit; and
    complementary pass gate circuitry coupled between said inverter circuitry and said second tunneling structure latch circuit.

* * * * *